(12) United States Patent
Shi et al.

(10) Patent No.: US 8,040,573 B2
(45) Date of Patent: Oct. 18, 2011

(54) METHOD, PROGRAM PRODUCT AND APPARATUS FOR TRANSLATING GEOMETRICAL DESIGN RULES INTO BOUNDARY CONDITIONS IN THE IMAGING SPACE SO AS TO DEFINE TEST PATTERNS FOR USE IN OPTICAL MODEL CALIBRATION

(75) Inventors: Xuelong Shi, San Jose, CA (US); Jang Fung Chen, Cupertino, CA (US); Douglas Van Den Broeke, Sunnyvale, CA (US)

(73) Assignee: ASML Masktools B.V., Veldhoven (NL)

( * ) Notice: Subject to any disclaimer, the term of this patent is extended or adjusted under 35 U.S.C. 154(b) by 289 days.

(21) Appl. No.: 11/889,587

(22) Filed: Aug. 14, 2007

(65) Prior Publication Data
US 2008/0068668 A1     Mar. 20, 2008

Related U.S. Application Data

(60) Provisional application No. 60/837,327, filed on Aug. 14, 2006.

(51) Int. Cl.
*G10K 7/06*     (2006.01)
*H04N 1/00*     (2006.01)

(52) U.S. Cl. ......... 358/406; 358/504; 358/1.9; 358/401; 382/162; 700/121

(58) Field of Classification Search .................. 358/406, 358/504, 1.9, 401; 382/162; 700/121
See application file for complete search history.

(56) References Cited

U.S. PATENT DOCUMENTS

| | | | |
|---|---|---|---|
| 7,404,174 B2* | 7/2008 | DeMaris et al. | 716/53 |
| 2007/0140552 A1* | 6/2007 | Fan et al. | 382/162 |
| 2007/0265725 A1* | 11/2007 | Liu et al. | 700/121 |

* cited by examiner

*Primary Examiner* — Mark K Zimmerman
*Assistant Examiner* — Quang N Vo
(74) *Attorney, Agent, or Firm* — Pillsbury Winthrop Shaw Pittman LLP

(57) ABSTRACT

A method of determining calibration test patterns to be utilized to calibrate a model for simulating the imaging performance of an optical imaging system. The method includes the steps of defining design rules associated with a given imaging process; defining a model equation representing the imaging performance of the optical imaging system; determining a boundary of an imaging signal space based on the design rules; selecting calibration patterns based on the boundary of the imaging signal space such that the calibration patterns are on the boundary or within the boundary of the imaging signal space; and storing the selected calibration test patterns, where the calibration test patterns are utilized to calibrate the model for simulating the imaging performance of the optical imaging system.

18 Claims, 8 Drawing Sheets

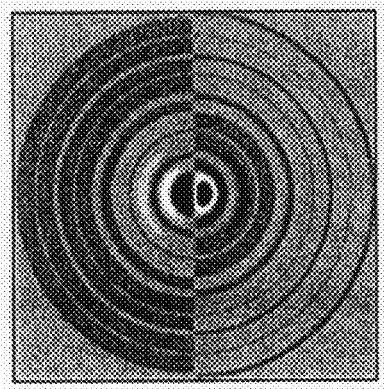 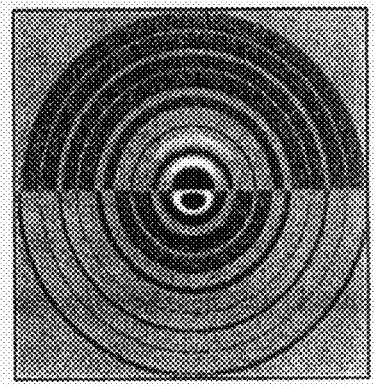
2ND KERNEL — FIG. 1A
3RD KERNEL — FIG. 1B
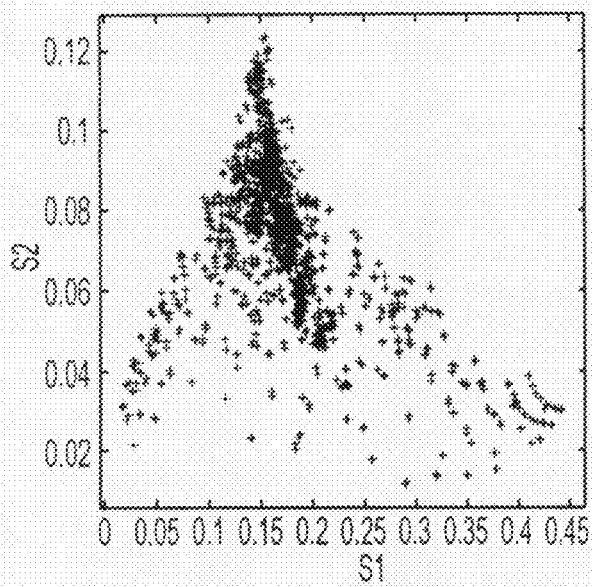 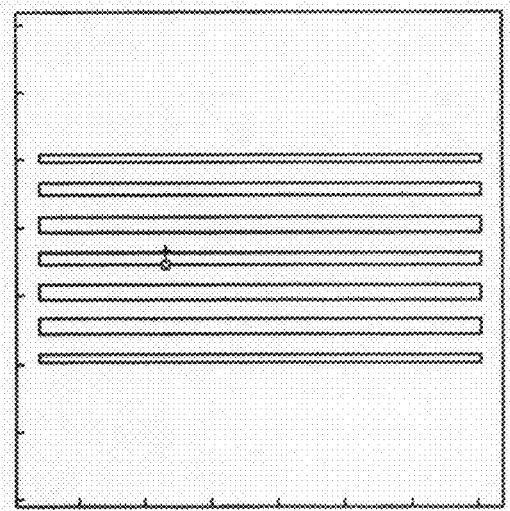
FIG. 2

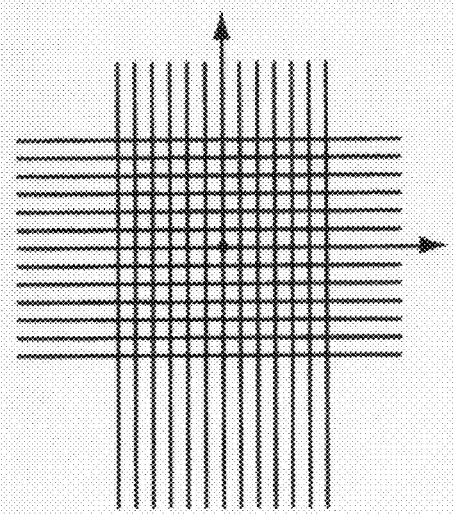
FIG. 3
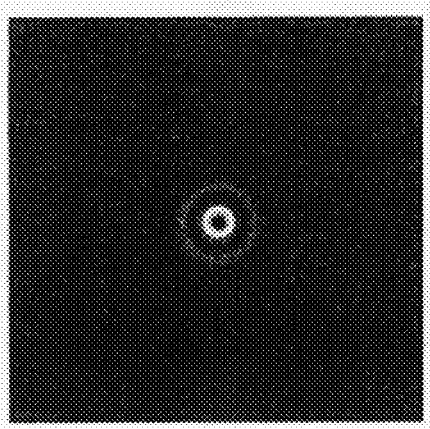  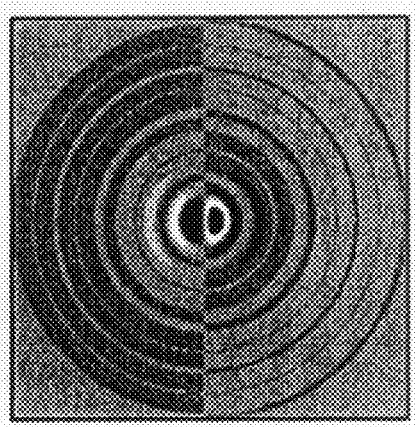
1ST KERNEL  2ND KERNEL
FIG. 4A  FIG. 4B

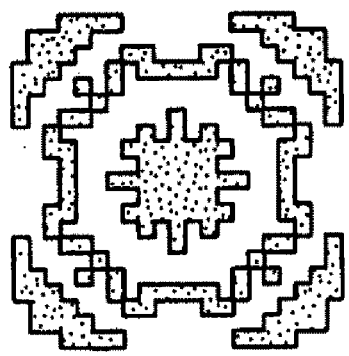
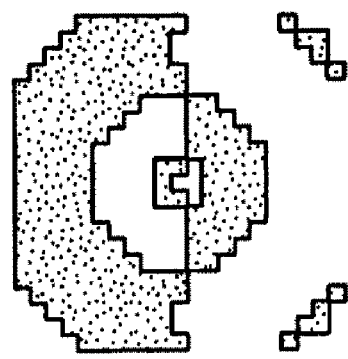
FIG. 5A　　　　　　　　FIG. 5B
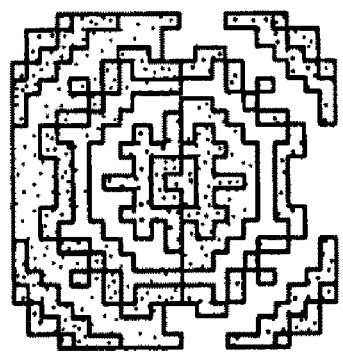
FIG. 6

METHOD, PROGRAM PRODUCT AND APPARATUS FOR TRANSLATING GEOMETRICAL DESIGN RULES INTO BOUNDARY CONDITIONS IN THE IMAGING SPACE SO AS TO DEFINE TEST PATTERNS FOR USE IN OPTICAL MODEL CALIBRATION

PRIORITY CLAIM

This application claims priority to Provisional Application Ser. No. 60/837,327, filed on Aug. 14, 2006, the contents of which are incorporated herein in its entirety.

TECHNICAL FIELD

This disclosure relates generally to lithographic simulation tools. More particularly, it relates to a method for generating test patterns to be utilized in the process of calibrating an imaging model utilized to simulate the imaging performance of the optical imaging system.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

In advanced photolithography, model based optical proximity correction (Model OPC) has become a necessity in order to achieve images with better fidelity and more robust process. The parameters in the OPC model must be determined by calibrating the model against experimental data on a set of test structures. Since the physical and chemical processes involved in photolithography process is rather complicated, an exact model formula/equation from first principles is difficult to achieve. In addition, optical proximity correction on a full chip imposes calculation speed requirements on any model of practical use. The complicated nature of the underlying processes together with the high speed requirement forces the model to be "empirical" in nature. This "empirical" component of the model causes the model parameters to be more sensitive to the test structures selected for the model calibration process.

Currently, the selection of test patterns for calibrating the simulation model is typically performed by an experienced designer. For example, the designer may select patterns comprising some frequently occurring features found in typical target patterns, and some features that historically have caused problems (experience), as well as some new features that are critical to the design. However, a selection of calibration or test patterns guided only by experience and intuition may not adequately calibrate the simulation model for all of the patterns and features the model may be utilized to actually simulate during operation.

Accordingly, there is need for a method for selecting/determining the calibration or test patterns to be utilized to calibrate the simulation model which optimizes the usefulness or robustness of the resulting model.

SUMMARY

This disclosure relates generally to a method, computer program product and apparatus for determining/selecting an optimal set of test patterns to be utilized in the model calibration process. It is the object of the calibration process that the resulting imaging model can be applied to any geometrical structure possible under the design rule constraints of the given process. The present invention provides a method for defining the imaging signal space that will be occupied by the target design pattern based on the geometrical design rules of the given process. Once the imaging signal space of the given geometrical design rules is defined (including boundaries), test structures which substantially fill in the regions of the imaging signal space can be readily identified. These test structures are then utilized to calibrate the imaging model, and result in the generation of a more accurate model and therefore improved simulation performance. Importantly, the process of the present invention provides a quantitative method for defining the imaging signal space and thereafter generating the calibration test patterns based on the geometrical design rules of the given process.

More specifically, the present invention relates to a method of determining calibration test patterns to be utilized to calibrate a model for simulating the imaging performance of an optical imaging system. In a first embodiment, the method includes the steps of defining design rules associated with a given imaging process; defining a model equation representing the imaging performance of the optical imaging system; determining a boundary of an imaging signal space based on the design rules; selecting calibration patterns based on the boundary of the imaging signal space such that the calibration patterns are on the boundary or within the boundary of the imaging signal space; and storing the selected calibration test patterns, where the calibration test patterns are utilized to calibrate the model for simulating the imaging performance of the optical imaging system.

As explained in more detail below, the method of the present invention provides significant advantages over the prior art. Most importantly, the method provides for the systematic determination of optimal calibration or test patterns to be utilized for calibrating a simulation model by determining the boundaries in the imaging signal space for a given geometrical design rule set, and then selecting calibration test patterns that substantially fill the imaging signal space defined by the boundaries. By utilizing these calibration test patterns, it is possible to calibrate the imaging model for substantially all of the potential features that may be imaged for the given geometrical design rule set and process.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively. Although specific reference may be made in this text to the use of the invention in the manufacture of ICs, it should be explicitly understood that the invention has many other possible applications. For example, it may be employed in conjunction with the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying drawings.

BRIEF DESCRIPTION OF THE DRAWINGS

FIGS. 1a and 1b illustrate examples the second and third kernels, respectively, associated with annular illumination.

FIG. 2 illustrates an example of calibration test patterns and the corresponding imaging signal space.

FIG. 3 illustrates an example of how cells are defined in accordance with the process of the present invention.

FIGS. 4a and 4b illustrate examples the first and second kernels, respectively, utilizing annular illumination in the given example.

FIG. 5a illustrates the result of overlapping the kernel of FIG. 4a with the cell structure of FIG. 3; and FIG. 5b illustrates the result of overlapping the kernel of FIG. 4b with the cell structure of FIG. 3.

FIG. 6 illustrates the result of overlapping the kernel of FIG. 5a with the kernel of FIG. 5b.

DETAILED DESCRIPTION

Figure 7:
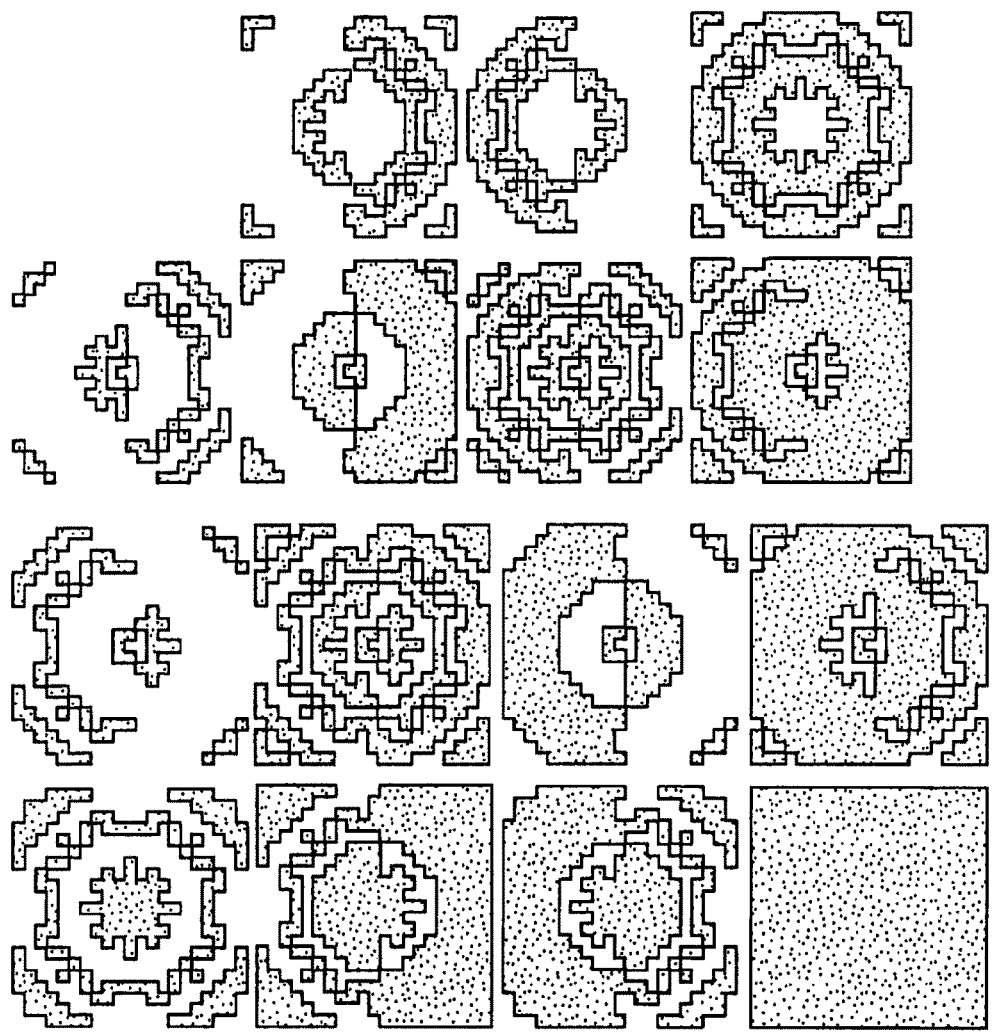
FIG. 7 illustrates exemplary intermediate test patterns resulting from the process of the present invention.

The present invention discloses a systematic method for locating/defining the boundary of an optical imaging signal space (input space) for a given set of geometrical design rules. The useful test patterns (calibration test patterns) for calibrating and validating an imaging system model will reside inside or on this boundary. The optical imaging signal space represents the potential designs and possible inputs into the system model, or into the real system. The geometrical design rules (such as, for example, minimum feature size and minimum spacing) can be translated into a bounded region of the imaging signal space. Thus, by determining the boundary of the imaging signal space based on the given design rules, it is possible to create a set of calibration test patterns to be utilized to calibrate a simulation model that will substantially cover all potential patterns permissible under the given design rules.

Prior to discussing the method of the present invention, a brief description regarding the theory of the present invention is provided. It is noted that the following discussion, and subsequently the description of the method of the present invention, refers to an eigen decomposition model. It is noted that any other suitable model could also be utilized in the process of the present invention.

The OPC models currently in implementation relate the image response to a function. The response can be, for example, but not limited to, edge placement error, edge threshold, system pseudo intensity, or any physical quantity. The function contains the signal variables $\{S_1, S_2, \ldots, S_N\}$ and the corresponding parameters that characterize how the physical quantity of interest responds to those signals. In the eigen decomposition model utilized in the given example, the signals are intensity-like quantities, as expressed in the following, $$S_i = \alpha_i |\phi_i \otimes M|^2 \qquad (1)$$

where $\phi_i$ is the ith kernel, $\alpha_i$ is the transmission value associated with ith kernel, and M is the mask transmission function. The kernels are optical imaging system setting dependent, and the algorithms to obtain such kernels have been described in previous patent applications, for example, U.S. patent application Ser. No. 10/981,750, filed Nov. 5, 2004, the contents of which are incorporated in their entirety by reference.

The signals, $S_i$, are from orthogonal kernels, and are therefore independent. Due to the band limited nature of the imaging system, the degrees of freedom in any image from such optical imaging system are finite. For imaging settings of practical use in current photolithography, typically only the first few signals are significant with respect to the simulation result. In most cases, only the first three signals dominate the final response. As all the illumination profiles must possess mirror symmetries with respect to x axis and y axis to ensure image stationary against focus variations, kernel degeneracy can arise in some cases. Kernels are called degenerate if their eigen values are the same. For example, the $2^{nd}$ and $3^{rd}$ kernels are degenerate for annular illumination, as shown in FIGS. 1a and 1b, respectively.

Because the annular illumination has rotational symmetry, its printing behavior is also geometry orientation independent. This suggests that signals from degenerate kernels should be grouped together when determining imaging behavior or response. Hereinafter, $S_2$ is defined as the signal sum from $2^{nd}$ and $3^{rd}$ kernels for annular illumination.

Each test structure used in the calibration process is quantified by first generating sampling points along the geometry edges and then calculating the signal values at those sampling points. By performing this process, each sampling point whose signals are $\{S_1, S_2, \ldots, S_N\}$ is represented by a point in the imaging signal space. Each test structure occupies a certain region in the imaging signal space, and all the test structures define the calibration space in the imaging signal space, as shown in FIG. 2.

FIG. 2 is generated using 790 test structures, with one sampling point for each test structure. Since the signal from $4^{th}$ kernel is much smaller than those from $1^{st}$ kernel ($S_1$) and from $2^{nd}$, $3^{rd}$ kernels ($S_2$), the following discussion will focus on using the ($S_1, S_2$) imaging signal space for explaining the principle of the present invention. It is noted that extension to considering higher orders of kernels is a straightforward process.

It is noted that even with 790 critical dimension (CD) measurements, which is a typical amount in current OPC model calibration, the question of whether the model calibrated using those 790 CD measurements can be reliably applied to any geometrical structures under certain design rule constraints remains an open question. As such, the objective of ensuring the model's applicability and the reduction of the OPC model calibration time becomes more important. The present invention accomplishes this task by translating the geometrical design rules into boundary conditions in the imaging signal space and then utilizes this information as the basis for selecting the calibration test patterns.

For example, it is assumed that the given geometric design rules define the minimum feature width as 100 nm, and the minimum space between features is also 100 nm, and that the sampling point (i.e., the test point) is located at the (0,0) position, and its surrounding neighbors can be divided into cells with size of (minimum feature size+minimum spacing)/ 2, as shown in FIG. 3.

It is noted that the reason for using the (minimum feature size+minimum spacing)/2 as the cell size is that geometries generated on such a cell grid can typically satisfy the geometrical design rule constraints approximately. If minimum feature size happens to be equal to minimum spacing, then no further shrinking or growing of the generated geometries needs to be performed. If minimum feature size is not equal to minimum spacing, then a subsequent shrinking or growing operation should be performed on the generated geometries to ensure such geometries will meet the geometrical design rule constraints. These foregoing points will become clear upon review of the descriptions set forth below.

For a binary mask, each cell can be assigned to be either 0 or 1 (two colors). It is assumed that the optical interaction effective range is around 1000 nm (although it is noted that the method of the present invention has minimal dependence on the true optical interaction range). Under such an assumption, there are approximately 400 cells located around the sampling point that can choose {0|1} independently. As such, the total number of combinations can reach $2^{400}$, and each combination represents a geometrical pattern that satisfies the geometrical design rule constraints, except possible corner touching between cells of the same color. Such corner touching does not change signals considerably, their existence only perturbs the boundary slightly. As such, it is not necessary to eliminate such corner touching when translating the geometrical design rules into a boundary in the imaging signal space. As a result, the boundary identified utilizing the method of the present invention is an approximate boundary, but it is sufficient for the purposes of defining the calibration test patterns necessary to calibration the imaging model.

An exemplary method of performing the present invention is now described. First, a function to be utilized (and calibrated) as the model of the imaging process is defined. As is known, such as function is dependent on the optical imaging tool and process to be modeled. Once the function is defined, it is decomposed into a series of independent functions (also referred to as communication channels), for example, orthogonal eigenfunctions or kernels. FIG. 4*a* and 4*b* illustrate the first and second kernels, respectively, for annular illumination. It is noted that in the given example, it is not necessary to consider the $3^{rd}$ kernel, as all structures constructed based on $1^{st}$ and $2^{nd}$ kernels possess mirror symmetry with respect to the x axis. As such, the signal from the $3^{rd}$ kernel relative to the sampling point located at origin (0,0) is always zero, due to anti mirror symmetry of the $3^{rd}$ kernel with respect to x axis.

The next step in the process is to define a grid cell size based on design rule parameters (minimum feature size and minimum cell size) using the following equation: grid cell size=(minimum feature size+minimum spacing)/2, where the minimum feature size and the minimum spacing are defined by the given geometrical design rules. This step determines what resolution or pixel size will be used to generate the test patterns. A sample point inside of an exemplary pattern illustrating design rules is illustrated in FIG. 3.

The next step is to digitize each eigen function (i.e., communication channel) or kernel utilizing the grid, and identify "coherent" regions (i.e., same-phase regions) for each eigen function or communication channel. This step is performed by overlapping the first kernel with the cell structures of FIG. 3 (grid), and integrating the kernel values within each cell. If the integrated value in a cell is non-negative, the cell is designated as +1, otherwise −1. Two digitized channels are illustrated in FIGS. 5*a* and 5*b*, one for each kernel. The white areas in FIG. 5*a* change coherently or simultaneously as a function of the first kernel or the first channel. The dark areas in FIG. 5*a* also change coherently or simultaneously as a function of the first kernel or first channel. The same process is performed for the second kernel with the results shown in FIG. 5*b*.

Thus, when overlapping each kernel with the cell structure, each cell can have either a positive or negative value, depending on the value of the kernel's integrated value at that particular cell location. For example, if cell i and cell j both have positive values, then they are in phase (i.e., "coherent"), thereby resulting in constructive interference.

In physical terms, the cells with value +1 have the same light field phase when they make image contributions to the sampling point (0,0) at the image plane. Similarly, the cells with value −1 have the same light field phase when they make image contributions to the sampling point (0,0) at the image plane. However, cells with value +1 and cells with value −1 have 180 degree phase difference when they meet at the sampling point (0,0) in the image plane. It is noted that when cells with same value change their mask tone collectively, the sampling point at (0,0) experiences the most abrupt change in the corresponding signal. Therefore, if the cells with same value in FIG. 5*a* change their mask tone collectively, the sampling point at (0,0) experiences the most abrupt change in the signal $S_1$. Likewise, if the cells with same value in FIG. 5*b* change their mask tone collectively, the sampling point at (0,0) experiences the most abrupt change in the signal $S_2$.

As such, in order to create neighbors for sampling point at origin (0,0) that define the boundary in the imaging signal space, it is necessary to overlap the two-colored map in FIG. 5*a* and the two-colored map in FIG. 5*b*, to obtain a four-colored map, as shown in FIG. 6, as the signals from first kernel and second kernel are independent. In other words, in the next step in the process, "collective" regions are identified by overlapping the digitized first kernel (see, FIG. 5*a*) with the digitized second kernel (see, FIG. 5*b*).

"Collective" regions means those cells regions that have the same value. Specifically, since the first kernel has cells with either 1 or 0 value, and the second kernel has cells with either 1 or 0 value, when overlapping the in-phase map of the first kernel with the in-phase map of the second kernel, there are four possible combinations (i.e., 1st kernel has a value of 1 and 2nd kernel has a value of 1; 1st kernel has a value of 1 and 2nd kernel has a value of 0; 1st kernel has a value of 0 and 2nd kernel has a value of 1; and 1st kernel has a value of 0 and 2nd kernel has a value of 0). Thus, there are four different types of regions. As explained in further detail below, boundary test structures can then be constructed by assigning each "collective" region the same mask property (i.e., transmission and phase), with there being $2^4$ combinations in total as shown in FIG. 7, and then placing test probe structures (in two orientations) at the center of the 16 boundary test structures, which results in 32 structures in total.

Figures 8A, 8B:
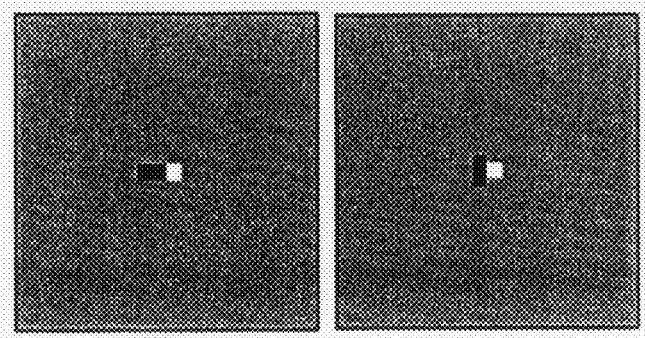
FIGS. 8a and 8b illustrate the placement of probe structures utilized during the overlapping process of the present invention.

More specifically, in the next step two probe structures are defined from the design rules. For example, if the minimum length of the features is 200 nm and the minimum width is 100 nm (as defined by the geometric design rules), then, for example, the following two probes illustrated in FIGS. 8*a* and 8*b* are created. The boundary structures define the signal boundary received at (0,0) on the image plane, but without a proper "probe structure" placed around (0,0), the signals at (0,0) may not be able to be recorded. The probe structure is preferably as small as possible so that it does not disturb the original boundary structures, but at the same time comply with the design rules.

In the foregoing example, annular illumination is utilized, and therefore the second and third kernels are degenerative. However, the third channel does not make a contribution to the overall signal for the vertical lines due to the symmetry of the third kernel. Further, because the second kernel has the vertical direction as its preferred direction, it is preferable to have a probe structure that is aligned with the vertical direction and a probe structure that is aligned normal to the vertical direction.

Figure 9:
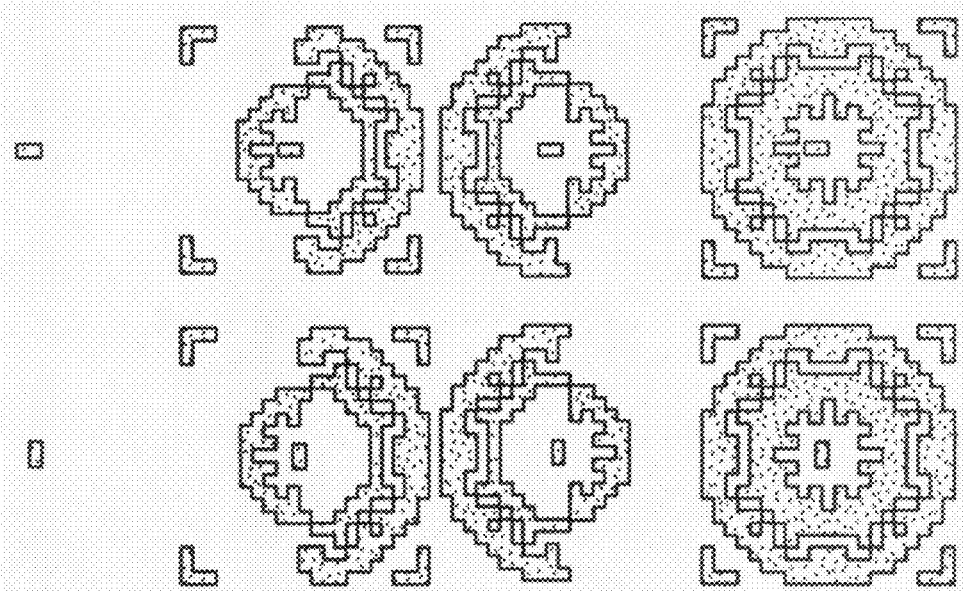
FIG. 9 illustrates exemplary final test patterns resulting from the process of the present invention.

In the next step, each of the above "probe" structures is overlapped with each structure in FIG. 7, and the following operations are performed during the overlapping process: 1) the dark area defined in the "probe" structure will be dark in each structure of FIG. 7; 2) the clear area defined in the "probe" structure will be clear in each structure of FIG. 7; and 3) the gray area defined in the "probe" structure will remain unchanged in each structure of FIG. 7. As a result, the perturbation to each structure in FIG. 7 is minimized when placing the "probe" sampling structure at the center while substantially maintaining the geometrical design rules. FIG. 9 illustrates a few of the final test structures.

Figure 10:
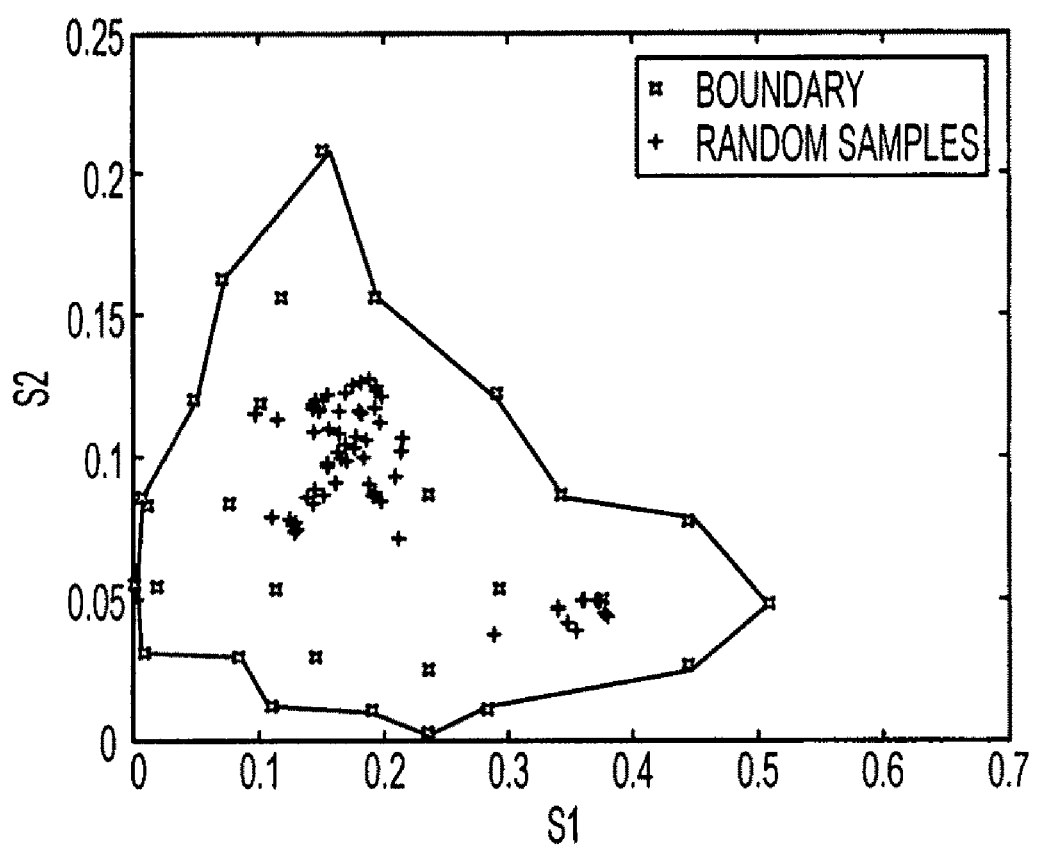
FIG. 10 illustrates the resulting boundary of the imaging signal space and the location of the test patterns relative to the boundary.

As noted above, in the given example there are 32 test structures in total. It is noted that not every member in the test pattern structure set (32 in total) is a structure that is on the boundary, but the boundary structure must be a member of that structure set. As such, it is possible to calculate the signal values at the origin point (0,0) for each structure of the set (32 in total). In FIG. 10, the "X" points represent the signal points from those 32 structures, while the "+" points are from through pitch structures, linearity structures, and line end structures under the same geometrical design rules. It is clear that traditional test structures only cover a very limited region within the region defined by the limiting boundary from geometrical design rules.

As noted above, the method of the present invention provides significant advantages over the prior art. Most importantly, the method provides for the systematic determination of optimal calibration or test patterns to be utilized for calibrating a simulation model by determining the boundaries in the imaging signal space for a given geometrical design rule set, and then selecting calibration test patterns that substantially fill the imaging signal space defined by the boundaries. By utilizing these calibration test patterns, it is possible to calibrate the imaging model for substantially all of the potential features that may be imaged for the given geometrical design rule set and process.

Furthermore, variations of the foregoing process are also patentable. For example, although the process is illustrated utilizing annular illumination in the foregoing example, the principle and method can be equally applied to other illuminations such as Quasar illumination. The same is true of the mask tone. For a tri-tone mask, each of the colored areas in FIG. 6 can have the value of $\{-1|0|+1\}$, instead of $\{0|1\}$ for binary masks. In this case, there will be $3^4$ candidate neighboring structures in total, instead of $2^4$ candidate neighboring structures for binary masks. To summarize, the principle and method is quite general in translating design rules into boundary in the imaging signal space.

Figure 11:
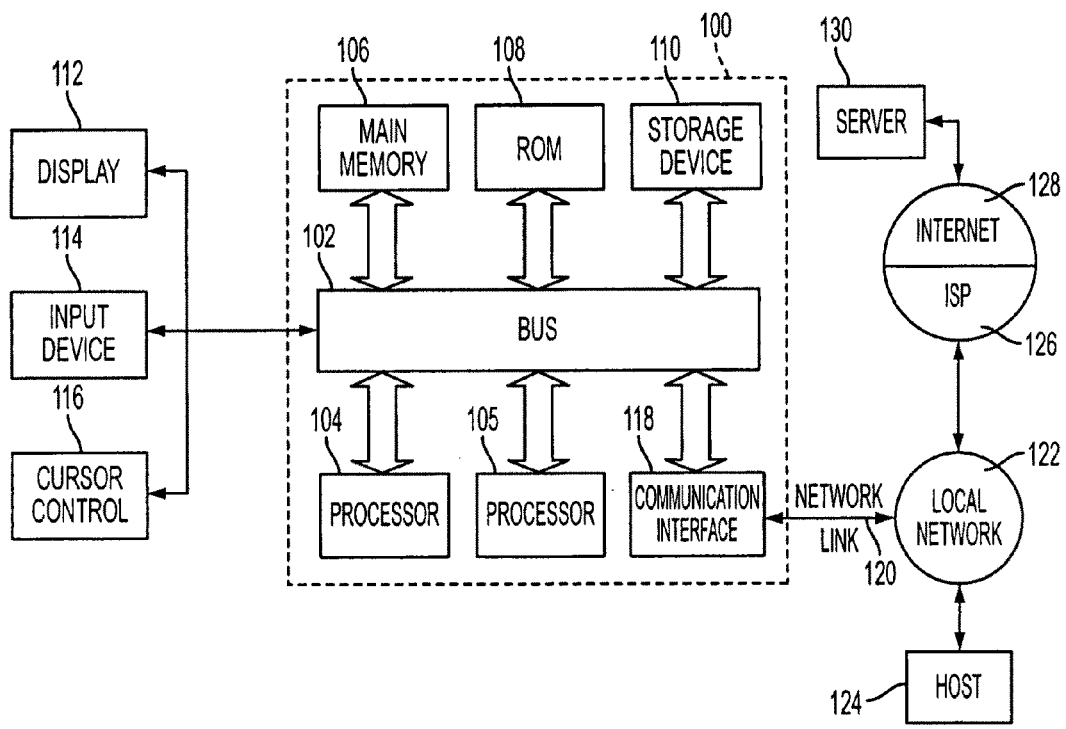
FIG. 11 is a block diagram that illustrates a computer system which can implement illumination optimization according to an embodiment of the present invention.

FIG. 11 is a block diagram that illustrates a computer system 100 which can assist in the method of generating/determining the calibration test patterns in accordance with the present invention. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

Simulation operations and determination of the calibration test patterns may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the determination of the calibration test patterns. The received code may be executed by processor 104 as it is received, and/or stored in storage device 110, or other non-volatile storage for later execution. In this manner, computer system 100 may obtain application code in the form of a carrier wave.

Figure 12:
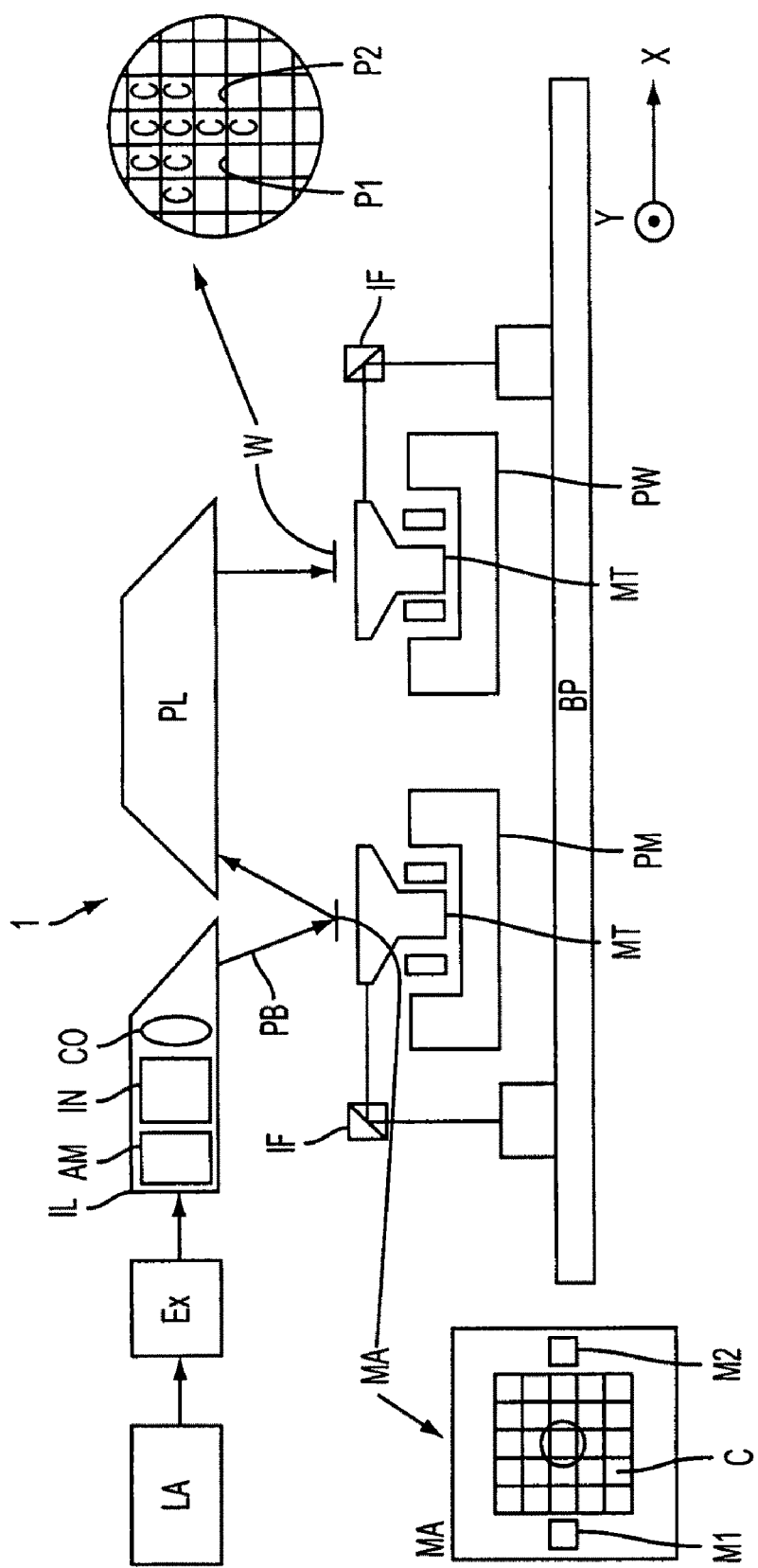
FIG. 12 schematically depicts an exemplary lithographic projection apparatus suitable for use with a mask designed with the aid of the disclosed concepts.

FIG. 12 schematically depicts an exemplary lithographic projection apparatus that could be the basis of simulation model to be tuned utilizing the calibration patterns generated/determined utilizing the process of present invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as a-outer and a-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method of selecting a set of calibration test patterns to be utilized to calibrate a model for simulating the imaging performance of an optical imaging system, said method comprising the steps of:
    defining design rules associated with a given imaging process;
    defining a model equation representing the simulated imaging performance of said optical imaging system, said model equation establishing an imaging signal space corresponding to imaging signal values obtained using said model equation;
    determining a boundary of said imaging signal space based on said design rules;
    selecting calibration test patterns based on said boundary of said imaging signal space such that imaging signal values corresponding to said selected calibration test patterns and obtained using said model equation are on the boundary or within said boundary of said imaging signal space; and
    storing said selected calibration test patterns, said selecting calibration test patterns being utilized to calibrate said model for simulating the imaging performance of the optical imaging system,
    wherein one or more of the above steps are implemented by a computer.

2. The method of determining calibration test patterns according to claim 1, wherein said model equation comprises a plurality of discrete functions.

3. The method of determining calibration test patterns according to claim 2, wherein each of said plurality of discrete functions comprises an eigenfunction.

4. The method of determining calibration test patterns according to claim 3, wherein each of the eigenfunctions are mutually orthogonal.

5. A computer program product having a non-transitory computer readable medium bearing a computer program for selecting a set of calibration test patterns to be utilized to calibrate a model for simulating the imaging performance of an optical imaging system, the computer program, when executed, causing a computer to perform the steps of:
    defining design rules associated with a given imaging process;
    defining a model equation representing the simulated imaging performance of said optical imaging system, said model equation establishing an imaging signal space corresponding to imaging signal values obtained using said model equation;
    determining a boundary of said imaging signal space based on said design rules;
    selecting calibration test patterns based on said boundary of said imaging signal space such that imaging signal values corresponding to said selected calibration test patterns and obtained using said model equation are on the boundary or within said boundary of said imaging signal space; and
    storing said selected calibration test patterns, said selected calibration test patterns being utilized to calibrate said model for simulating the imaging performance of the optical imaging system.

6. The computer program product according to claim 5, wherein said model equation comprises a plurality of discrete functions.

7. The computer program product according to claim 6, wherein each of said plurality of discrete functions comprises an eigenfunction.

8. The computer program product according to claim 7, wherein each of the eigenfunctions are mutually orthogonal.

9. A computer-implemented method of calibrating a model for simulating the imaging performance of an optical imaging system, said method comprising the steps of:
    selecting a set of calibration test patterns to be utilized to calibrate said model; and
    adjusting variable parameters of said model such that a simulated imaging result of said model matches an actual imaging result of said calibration test patterns within a predefined error criteria;
    wherein said selection of said set of calibration test patterns comprises:
    defining design rules associated with a given imaging process;
    defining a model equation representing the simulated imaging performance of said optical imaging system, said model equation establishing an imaging signal space corresponding to imaging signal values obtained using said model equation;
    determining a boundary of said imaging signal space based on said design rules;
    selecting calibration test patterns based on said boundary of said imaging signal space such that imaging signal values corresponding to said selected calibration test patterns and obtained using said model equation are on the boundary or within said boundary of said imaging signal space; and
    storing said selected calibration test patterns, said calibration test patterns being utilized to calibrate said model for simulating the imaging performance of the optical imaging system,
    wherein one or more of the above steps are implemented by a computer.

10. The method of calibrating a model for simulating the imaging performance of an optical imaging system according to claim 9, wherein said model equation comprises a plurality of discrete functions.

11. The method of calibrating a model for simulating the imaging performance of an optical imaging system according to claim 10, wherein each of said plurality of discrete functions comprises an eigenfunction.

12. The method of calibrating a model for simulating the imaging performance of an optical imaging system according to claim 11, wherein each of the eigenfunctions are mutually orthogonal.

13. The method of determining calibration test patterns according to claim 1, wherein said imaging signal space has dimensions corresponding to a number of kernels in said model equation.

14. The method of determining calibration test patterns according to claim 13, wherein selecting calibration test patterns includes:

defining a grid of points corresponding to a test structure based on said design rules;

digitizing a plurality of the kernels utilizing the grid of points;

identifying a collective region corresponding to overlapping portions of the digitized kernels; and using the identified collective region to construct one of the selected calibration test patterns.

15. The computer program product according to claim 5, wherein said imaging signal space has dimensions corresponding to a number of kernels in said model equation.

16. The computer program product according to claim 15, wherein selecting calibration test patterns includes:

defining a grid of points corresponding to a test structure based on said design rules;

digitizing a plurality of the kernels utilizing the grid of points;

identifying a collective region corresponding to overlapping portions of the digitized kernels; and using the identified collective region to construct one of the selected calibration test patterns.

17. The method of calibrating a model for simulating the imaging performance an optical imaging system according to claim 9, wherein said imaging signal space has dimensions corresponding to a number of kernels in said model equation.

18. The method calibrating a model for simulating the imaging performance an optical imaging system according to claim 17, wherein selecting calibration test patterns includes:

defining a grid of points corresponding to a test structure based on said design rules;

digitizing a plurality of the kernels utilizing the grid of points;

identifying a collective region corresponding to overlapping portions of the digitized kernels; and using the identified collective region to construct one of the selected calibration test patterns.

* * * * *